United States Patent [19]

Premerlani

[11] Patent Number: 4,547,726
[45] Date of Patent: Oct. 15, 1985

[54] MEANS AND METHOD FOR MEASURING POWER SYSTEM FREQUENCY

[75] Inventor: William J. Premerlani, Scotia, N.Y.

[73] Assignee: General Electric Company, Schenectady, N.Y.

[21] Appl. No.: 519,335

[22] Filed: Aug. 1, 1983

[51] Int. Cl.[4] ............................................. G01R 23/02
[52] U.S. Cl. ................................. 324/78 Z; 324/78 D
[58] Field of Search ................. 324/78 D, 78 R, 78 Z, 324/79 D, 86

[56] References Cited

U.S. PATENT DOCUMENTS

| | | | |
|---|---|---|---|
| 3,755,734 | 8/1973 | Blanyer | 324/78 Z |
| 3,895,293 | 7/1975 | Munz | 324/78 Z |
| 4,123,704 | 10/1978 | Johnson | 324/78 Z |
| 4,317,223 | 2/1982 | Farmer | 455/115 |

OTHER PUBLICATIONS

A. G. Phadke et al., "A New Measurement Technique for Tracking Voltage Phasors, Local System Frequency, and Rate of Change of Frequency", IEEE Transactions on Power Apparatus and Systems, vol. PAS-102, No. 5, May 1983, pp. 1025-1038.

Primary Examiner—Michael J. Tokar
Assistant Examiner—R. Raevis
Attorney, Agent, or Firm—George B. Fox; James C. Davis, Jr.; Bernard J. Lacomis

[57] ABSTRACT

Samples from a first and second cycle of a system signal are used to generate discrete Fourier transforms for the respective first and second cycle. Multiplication of the discrete Fourier transform of the second cycle by the complex conjugate of the discrete Fourier transform of the first cycle produces a frequency deviation phasor whose angle with respect to the real axis is representative of the frequency deviation of the system signal from a predetermined reference frequency. Actual system frequency may be determined by obtaining the inverse tangent of the angle of the frequency deviation phasor with respect to the real axis.

Apparatus for determining the frequency and frequency deviation of a system signal is disclosed as is a method and apparatus for determining frequency and frequency deviation of a system signal comprising a plurality of phases.

50 Claims, 8 Drawing Figures

FREQUENCY/DEVIATION DETERMINATION FOR 3-PHASE SYSTEM

FIG. 4

DFT CALCULATION OF
FUNDAMENTAL FREQUENCY COMPONENT

FIG. 5

COMPUTATION OF
$\bar{D}_a = \bar{V}_{a2} * \bar{V}_{a1}^*$

FIG. 6

MEANS AND METHOD FOR MEASURING POWER SYSTEM FREQUENCY

BACKGROUND OF THE INVENTION

This invention relates to measuring system frequency and more particularly to a means and method for measuring power system frequency deviation from a predetermined reference frequency without measuring the time between zero crossings of the voltage waveform. The system may be an electrical power system, a rotating mechanical system or any other system experiencing periodic motion from which a parameter representative of the periodic motion is available. Electrical power systems are discussed generally herein due to their widespread applicability.

Mechanical frequency limits are established to protect an electrical generator prime mover, typically a turbine; it is generally undesirable to operate a turbine above or below predetermined mechanical resonance limits or frequencies. Thus, it is important to determine the operating frequency of the turbine. Typically electrical signal frequency, indicative of turbine mechanical frequency, is monitored and electrical frequency limits are predetermined to ensure that the turbine operates within the permissible band of mechanical frequencies.

Further, before interconnecting loads supplied by different generators, it is necessary to ensure that both generators are operating at the same electrical frequency in order to prevent voltage surges and voltage transients which may damage the loads should interconnection of non-synchronous generators be attempted.

Previously known electrical power frequency and frequency deviation measuring techniques typically employ means for measuring the time between zero crossings of the voltage waveform and generating frequency and/or frequency deviation values from these measurements. These methods are sensitive to noise on the power lines since voltage spikes or glitches may be detected as zero crossings of the voltage waveform thereby leading to erroneous frequency determinations. Further, non-fundamental components may produce signals detected as zero crossings which could also produce erroneous frequency results.

Improper or erroneous frequency determinations may lead to costly premature system shutdown if the system frequency does not actually exceed the predetermined frequency limits and the frequency monitor indicates it does exceed the limits or may result in damage to the prime mover and other system equipment if the system frequency does actually exceed the predetermined limits and the frequency monitor indicates it does not exceed the limits. Further, non-synchronous generators may be interconnected, resulting in problems hereinbefore described, if the frequency monitor erroneously indicates that the frequencies of the generators are the same.

A recent article, "A New Measurement Technique for Tracking Voltage Phasors, Local System Frequency, and Rate of Change of Frequency," A. G. Phadke et al., IEEE Transaction on Power Apparatus and Systems (May, 1983), purports to determine power system deviation. The authors present a technique which uses the sum and difference of two vectors, with an assumption that the vectors are perpendicular. This assumption typically leads to erroneous results since the vectors are generally not perpendicular. In fact, they are perpendicular only when the reference frequency is equal to the power system frequency. It is estimated that the present invention is 3–10 times more accurate than that disclosed by Phadke et al.

Accordingly, it is an object of the present invention to provide a means and method for measuring system frequency which do not employ a zero crossing technique.

Another object is to provide a means and method for measuring system frequency which do not respond to non-fundamental signal components.

Yet another object is to provide a means and method for accurately determining system frequency and frequency deviation.

BRIEF DESCRIPTION OF THE INVENTION

In accordance with the present invention, apparatus for determining a system signal frequency wherein the system signal includes a plurality of phases, comprises a first and second plurality of transform means each respectively adapted to receive a first and second plurality of samples indicative of a respective first and second cycle of each respective phase of the system signal for generating the respective discrete Fourier transform of the respective first and second cycle of each respective phase of the system signal in response to the respective first and second plurality of samples wherein each respective first cycle precedes each respective second cycle. The system signal may be supplied by an electrical power system, a rotating mechanical system or any other system experiencing periodic motion from which parameter (system signal) representative of the periodic motion is available. A plurality of multiplying means, each respectively coupled to the output of one of the first and one of the second plurality of transform means, and both adapted to receive samples from the same phase of the system signal, are provided for multiplying the discrete Fourier transform of the second cycle by the complex conjugate of the discrete Fourier transform of the first cycle to form a plurality of phase deviation phasors. Adder means having inputs respectively coupled to the output of each of the plurality of multiplying means sum each of the respective phase deviation phasors to form a frequency deviation phasor. Conditioning means coupled to the output of the adder means provide signals indicative of under-frequency and over-frequency, respectively, of the system signal.

Further, in accordance with the present invention, a method for determining frequency deviation of a signal from a predetermined reference frequency, wherein the signal includes a plurality of phases, comprises sampling at least one of the phases at least four predetermined instants during each of a first and second cycle of the at least one of the phases, wherein the first cycle precedes the second cycle, to generate a data value for each instant. A first and second phasor representative of each of the first and second cycles of the at least one of the phases and the second phasor is multiplied by the complex conjugate of the first phasor to generate a phase deviation phasor for the at least one of the phases phases wherein the angle of the phase deviation phasor with respect to the real axis is indicative of frequency deviation of the respective phase from the predetermined reference frequency.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION OF THE INVENTION

The present invention is generally described in relation to a three-phase electrical power system, however, its applicability is not so limited. The apparatus and method of the present invention may be used to determine the frequency and/or deviation from a desired frequency for any periodic function or motion, such as rotation (motor, generator, etc.) wherein a variable, such as shaft position, indicative of the function or motion is available to define a phasor which represents the function or motion. A phasor is a quantity having both magnitude and direction, such as a $+jb$ (rectangular coordinates) and $Ze^{-j\theta}$ (polar coordinates), used to represent a time-varying quantity.

Prior known methods of electrical signal frequency and frequency deviation measurement generally employ a technique which relies on monitoring zero crossings of the fundamental frequency of the electrical signal in order to determine the frequency thereof. These methods may be detrimentally affected by responses to non-fundamental components of the signal.

Figure 1:
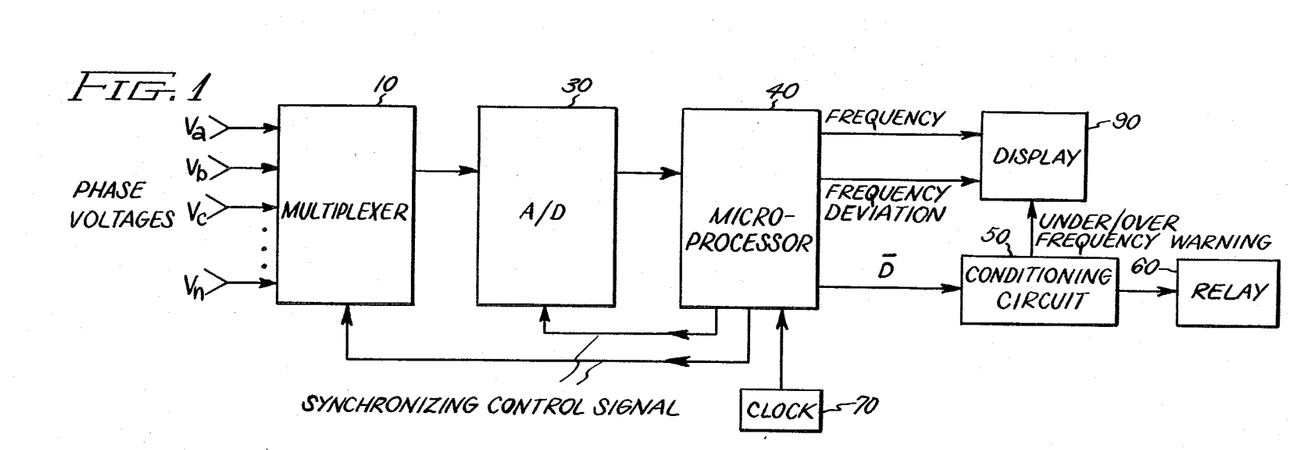
FIG. 1 is a block diagram of apparatus useful with the present invention.

Referring to the drawing and more specifically to FIG. 1 thereof, a block diagram of a monitoring system useful for determining power system frequency and frequency deviation in response to monitored circuit parameters in accordance with the present invention is shown. Although the present invention operates with single or two-phase power systems as well as power systems having more than three phases, a three-phase power system is used as an example herein for convenience and because of its widespread applicability.

The monitoring system comprises multiplexer 10 having respective inputs supplied with a parameter, typically line-to-neutral or line-to-line phase voltage $V_a$, $V_b$, $V_c$ ... $V_n$, which may be appropriately scaled, wherein a, b, c ... n differentiates a parameter from one phase from each other phase of the power system.

The monitoring system further comprises an analog-to-digital (A/D) converter 30 coupled to the output of multiplexer 10, a microprocessor 40 coupled to the output of A/D converter 30, a conditioning circuit 50 (described in detail in conjunction with FIG. 7) coupled to a first output of microprocessor 40, a switching means 60, such as a relay or contactor, connected to a first output of conditioning circuit 50, clock circuitry 70 coupled to an input of microprocessor 40 and display means 90 coupled to a pair of outputs of microprocessor 40 whereat frequency and frequency deviation signals, respectively, are available and to a second output of conditioning circuit 50 whereat under- and over-frequency warning signals are available. Switching means 60 typically provides control for removing power to all or a selected portion of the power system when an under- or over-frequency condition exists in the power system.

Microprocessor 40 may be a type 8051 (8-bit) integrated circuit, or the like, manufactured by Intel, Inc. of Santa Clara, Calif. A type 8051 microprocessor includes an integrated read only memory (ROM) in which a program may be stored. If the microprocessor selected does not include a ROM then a separate ROM may be interfaced with the selected microprocessor as is known in the art. Clock circuitry 70 typically comprises a crystal oscillator (not shown) for providing a master frequency signal and divider circuitry (not shown) for providing fractional multiple frequency signals of the master frequency signal to microprocessor 40 for timing and synchronization.

The timing for triggering an output signal from multiplexer 10 and actuating analog-to-digital conversion in A/D converter 30 is provided by sychronizing control signals available at appropriate outputs of microprocessor 40 and supplied to the appropriate unit. Multiplexer 10 acts as a switch having multiple inputs each capable of respectively supplying a signal to the output thereof in response to the status of the synchronizing control signal supplied thereto.

The output signal of A/D converter 30 is a binary digital representation of the respective sampled phase parameter input signal, e.g. phase A voltage $V_a$, available at its input from the output of multiplexer 10. A/D converter 30 is selected to provide a digital output signal which is compatible with microprocessor 40. If the digital output signal is not voltage compatible, a buffer or logic level shifter (not shown) is required to interface between the output of A/D converter 30 and input of microprocessor 40 and if the output signal is not bit compatible (e.g. A/D provides more than 8 bits output while microprocessor can only use 8 bits at a time) then a data latch such as a type 8282 octal latch manufactured by Intel, Inc., or the like, (not shown) controlled by the microprocessor is required to interface between the output of A/D converter 30 and input of microprocessor 40.

The frequency and frequency deviation signal outputs of microprocessor 40 are binary digital representations of the respective parameters. Display means 90, may comprise a meter or numeric lioht indicator for indicating actual frequency and frequency deviation, and may further include visual means, such as a colored or flashing light, and/or audio means, such as a bell, whistle or siren, for providing indication of an under- or over-frequency condition.

Figure 2A:
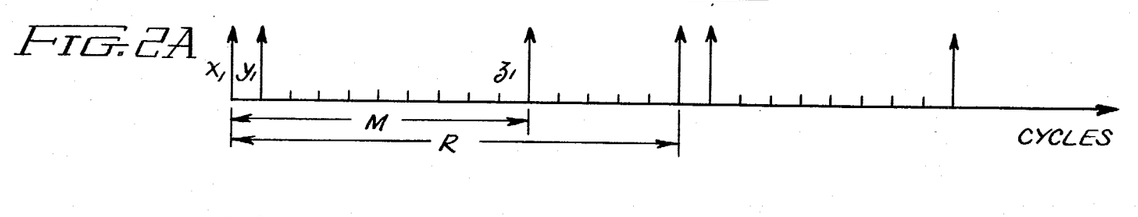
FIGS. 2A and 2B are timing diagrams of a typical sampling operation in accordance with the present invention.
Figure 2B:
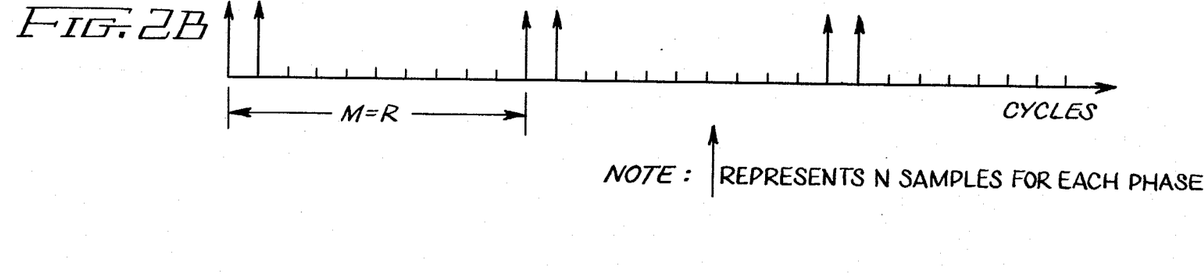

Referring to FIGS. 2A and 2B, line-to-neutral or line-to-line voltages are sampled N times per cycle per phase, wherein N is controlled by the program stored in microprocessor 40 (FIG. 1) which coordinates the synchronizing control signals provided to multiplexer 10 and A/D converter 30 (FIG. 1). The sampling rate (N) must be at least 4 samples per cycle and it should be an even number in order to remove any DC offset in the measured voltages. The higher the sampling rate, the greater the accuracy. A sampling rate of between 8 and 24 samples per cycle is preferred with a rate of 12 samples per cycle most preferred. Samples for each phase should be evenly spaced over a cycle. The present invention operates with samples available from one or more phases with accuracy increasing as the number of phases supplying samples is increased. It is not necessary to use simultaneous sample-and-hold circuitry between the output of multiplexer 10 (FIG. 1) and input of A/D converter 30 (FIG. 1) in order to produce correct frequency results with the present invention, since the phasors generated from samples taken without such circuitry may be rotated, but effects of rotation are eliminated using complex number multiplication in accordance with the present invention.

It is also possible to use samples from less than or more than a complete cycle of the signal being sampled, in which case it is assumed that a portion of the signal not sampled is symmetrical to the portion which is sampled. For example, if only the first half of a cycle is sampled, it is assumed that the second half of the cycle is negatively symmetrical (mirror image) with the sampled first half.

Shown in FIG. 2A is a general sampling scheme in accordance with the present invention. Samples are taken during consecutive cycles $x_1$, and $y_1$, and at a later cycle $z_1$, M cycles after cycle $x_1$. Selection of the value of M is described in detail below. The selection pattern is repeated R cycles after cycle $x_1$. The value of R is selected to provide the desired transient response, i.e. how often the frequency and frequency deviation values are updated. A typical value of R is about 0.5 seconds. Shown in FIG. 2B is the sampling scheme wherein $M = R$. The present invention may use any pair of samples, i.e. $x_1$, $y_1$; $x_1$, $z_1$; $y_1$ $z_1$, providing the range criteria described below are satisfied. Using consecutive cycle samples, e.g. $x_1$, $y_1$, provides a monitoring range having a greater frequency deviation while having less accuracy, and using spaced cycle samples, e.g. $x_1$, $z_1$, provides a monitoring range having a lesser frequency deviation while providing greater accuracy.

Data are required from two consecutive sets of samples every M cycles wherein M is greater than or equal to two. The value of M establishes computational loading of microprocessor 40 (FIG. 1) and transient response of the method. As M decreases, the transient response delay to a step change in frequency decreases at the expense of increased computational burden. A typical value of M is ten. For minimum response delay, data may be taken for every cycle in which case M is equal to two.

A known method for calculating frequency from rotation measures the rotation of a signal phasor every cycle with respect to a non-rotating phasor until a predetermined minimum accumulated rotation is obtained. The accumulated rotation is then divided by the number of cycles which produced it to obtain the rotation or deviation per cycle. This method results in a tradeoff between accuracy and time delay. That is, the closer the actual frequency of the signal is to the non-rotating phasor, the greater the accuracy but the longer the time interval necessary to accumulate the minumum rotation in order to compute the deviation. This method also requires that phasor rotation be measured every cycle, which imposes a computational burden on the system.

The method of the present invention measures the rotation of a signal phasor over a predetermined time interval e.g. two cycles of the signal being monitored every ten cycles. An advantage of this technique is that calculations do not have to be performed every cycle of the signal, thus reducing the computational burden on the system.

When the method of the present invention is used, it is generally desirable to implement more than one frequency deviation range. The maximum attainable frequency deviation range about a predetermined reference frequency ($f_o$) is achieved by measuring the frequency deviation of a signal over two successive cycles and the accuracy of the measurement is established by repeating the measurement every M cycles of the signal. Choosing the value of M for a deviation range determines the accuracy, computational burden and frequency band of validity for the deviation range. For example, the larger the value of M for a specific deviation range, the greater is the accuracy and the less are the computational burden and the frequency band of validity. The result of the measurement over two successive cycles is used to determine if the more sensitive deviation range, i.e. $M > 2$, is valid. The frequency band of validity is established by the necessary constraint that the rotation of phasor $V_{\alpha 2}$ with respect to phasor $V_{\alpha 1}$ must be less than 180° over the period determined by M.

Complex number arithmetic as used in this specification refers to the manipulation of expressions having both a real and an imaginary portion (indicated by the operator j). Examples of such expressions are: $a + jb$ and $e^{-j\theta} = \cos\theta - j\sin\theta$, wherein $j = \sqrt{-1}$. The complex conjugate of $a + jb$ is $a - jb$ and of $e^{-j\theta}$ is $e^{j\theta}$, i.e. the same terms with the sign of the imaginary part changed.

Figure 3:
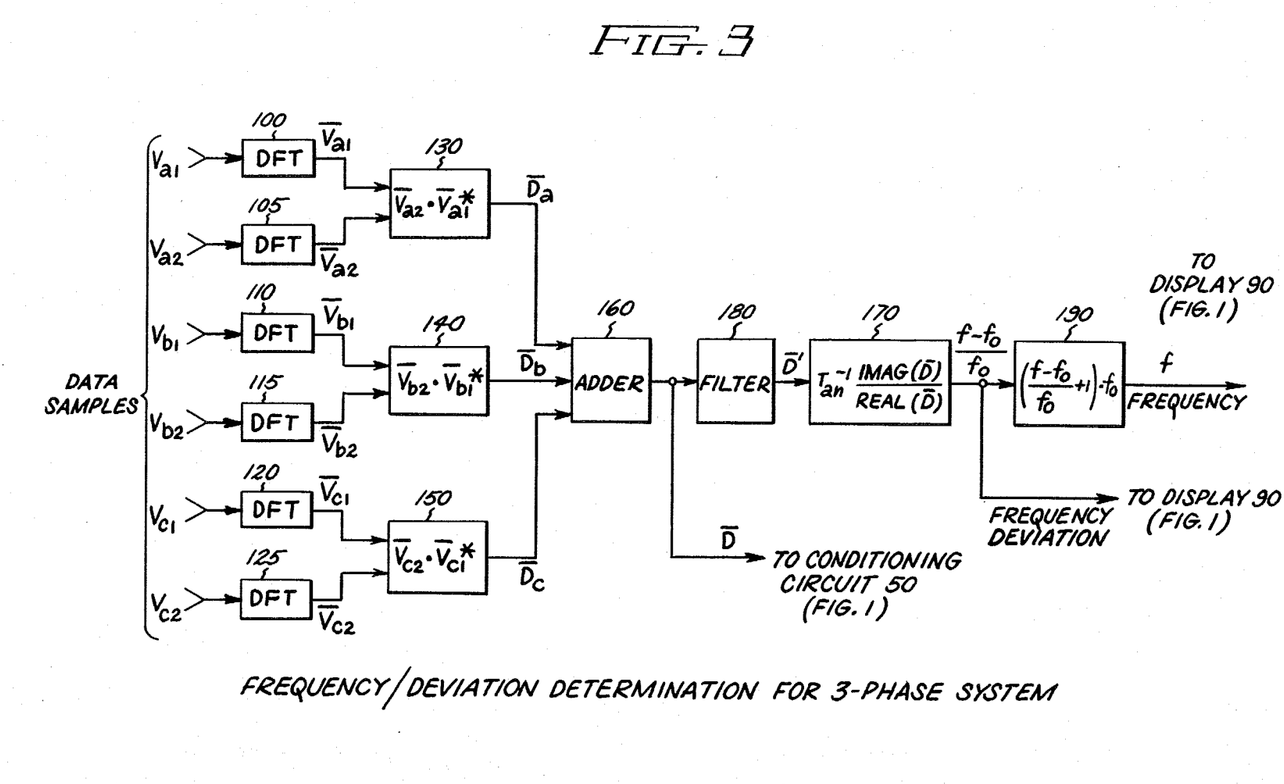
FIG. 3 is a block diagram of apparatus for determining frequency and frequency deviation in a 3-phase system in accordance with the present invention.

Referring to FIG. 3, a block diagram of discrete apparatus for determining frequency deviation of a 3-phase system is shown. In a preferred embodiment of the present invention, all apparatus of FIG. 3 is implemented by programs used in conjunction with microprocessor 40 (FIG. 1).

A plurality of transform means 100, 105, 110, 115, 120 and 125, such as single frequency (i.e. fundamental frequency) discrete Fourier transform (DFT) circuitry, are arranged in pairs, e.g. DFT circuitry 100 and 105 comprise a pair, and each member of the pair is supplied with data samples, e.g. $V_{a1}$ and $V_{a2}$, of the respective phase and cycle. A typical discrete Fourier transform circuit may comprise a TMS-320 programmable digital signal processor manufactured by Texas Instruments, or the like. The output of each respective member of the pair is coupled to a respective one of a plurality of multiplying means 130, 140 and 150. The output of each multiplying means is connected to a respective input of adder circuitry 160. The output of adder circuitry 160 is respectively connected to conditioning circuit 50 (FIG. 1) and filter circuitry 180. The output of filter circuitry 180 is connected to inverse tangent circuitry 170. The output of inverse tangent circuitry 170 is connected to frequency conversion circuitry 190 and display means 90 (FIG. 1). The output of frequency conversion circuitry 190 is connected to display means 90 (FIG. 1).

In operation, respective phasor values, e.g. $\overline{V}_{a1}$, of each respective group of data values of samples (the number of which is determined by N) of the phase voltage, e.g., $V_{a1}$, for each respective sampled cycle are computed according to the following equation:

$$\overline{V}_{\alpha\beta}(m) = \frac{2}{N} \sum_{k=m-N+1}^{m} V_{\alpha\beta}(k\Delta t) e^{\frac{-j2\pi k}{N}} \quad (1)$$

wherein
$\alpha$ = phase indicator, a, b, c, ... n;

$\beta$ = cycle number = 1, 2;
$\Delta t$ = sampling period;

(i.e. interval between samples = $\left(\frac{2\pi}{N}/f_o\right)$)

N = samples per cycle;
k = summation index (integer); and
m = real time step, by discrete Fourrier transform (DFT) circuitry 100–125, respectively. DFT circuitry 100, 105, etc. are identical and are described in detail accompanying FIG. 4. For a three-phase system the calculation of equation (1) is performed six times over the range, i.e. once for each phase of each sampled cycle. The polar representation is calculated using its rectangular coordinate equivalent form with the sine and cosine functions determined using any convenient method, such as look-up tables. Phasor values $\overline{V}_{\alpha\beta}(m)$ may be appropriately scaled to eliminate the term 2/N from the right side of equation (1).

Equation (1) implicitly assumes the first sample is taken at time $t=0$. This is equivalent to assuming phase angle measurements are with respect to the first sample. Due to any difference between actual system frequency and the predetermined reference frequency $(f_o)$, the computed phasors will rotate, precluding an absolute phase angle measurement. However, all phasors calculated with the method of the present invention rotate at the same slip frequency with fixed relative angles. Typically phasor calculations are based on the difference between phase angles of two phasors and are thus not affected by the rotation.

After phasors are calculated for both sampled cycles of each phase, the following calculation, for determining phase deviation phasor $\overline{D}_\alpha$, is performed for each phase:

$$D_\alpha = V_{\alpha 2} \cdot V_{\alpha 1}^* \qquad (2)$$

(*denotes complex conjugate)

in phasor multiplying means 130, 140, and 150, respectively. Phasor multiplying means 130, 140 and 150 are identical and are described in detail accompanying FIG. 5.

The resultant phase deviation phasor D of each phase has a magnitude equal to the product of the magnitudes of the voltage phasors $V_{\alpha 2}$ and $V_{\alpha 1}$ for each respective sampled cycle and a phase angle which depends on the deviation of the actual frequency from the predetermined reference frequency. That is, $$\overline{D}_\alpha \cong \frac{|V_{\alpha 1}| \cdot |V_{\alpha 2}| \cdot \sin \pi \frac{(f-f_o)}{f_o}}{V^2 \sin \frac{2\pi}{N} \frac{(f-f_o)}{f_o}} \cdot e^{-j2\pi \frac{(f-f_o)}{f_o}} \qquad (3)$$

wherein:
$|V_{\alpha 1}|$ and $|V_{\alpha 2}|$ = magnitude of phasor voltage;
f = actual system frequency;
$f_o$ = predetermined reference frequency; and
N = samples/cycle.

The phase deviation phasors $\overline{D}_\alpha$ are fixed with respect to each other and colinear (assuming all phases are rotating at the same velocity). That is, they do not rotate with respect to each other and the phase angle of each phase deviation phasor with respect to the real axis is the same for each respective phase. Thus, they can be added directly in adder 160 (or by programming microprocessor 40 (FIG. 1) to perform addition) to produce a frequency deviation phasor $\overline{D}$:

$$D = D_a + D_b + D_c \qquad (4)$$

In order to generate correct frequency results, all phases must be functioning at the same frequency. If they are not, frequency deviation phasor $\overline{D}$ of equation (4) is a weighted average of the individual frequencies, with weighting factors proportional to the square of the phase voltages.

The frequency deviation phasor $\overline{D}$ may be provided to a filter 180 producing a filtered frequency deviation phasor $\overline{D}'$ at its output. Filter 180, which removes noise from frequency deviation phasor $\overline{D}$, may comprise a first-order low-pass filter having a time constant of about 4 seconds. Of course, other filters may be used with the understanding that there is a tradeoff between accuracy (i.e. amount of noise removed) and time to respond to a change in the frequency deviation phasor $\overline{D}$. The filtered output signal $\overline{D}'$ from filter 180 (FIG. 1) is supplied to inverse tangent circuitry 170 which conditions it to ultimately provide display signals.

The method of the present invention generates correct frequency results with any amount of phase angle unbalance or phase magnitude unbalance in the phase voltages. Further, it is not necessary to supply samples sequentially, i.e. in the order of phase rotation, or to supply samples from all phases, as long as samples from at least one phase are available. However, greatest accuracy is obtained when samples are provided from all phases.

The actual system frequency f is related to the frequency deviation phasor $\overline{D}$ according to the following equation:

$$\frac{\text{IMAG}(\overline{D})}{\text{REAL}(\overline{D})} = \tan\left[2\pi\left(\frac{f-f_o}{f_o}\right)\right] \cdot \eta(f, f_o, N) \qquad (5)$$

wherein:
IMAGE($\overline{D}$) = imaginary portion of $\overline{D}$
REAL($\overline{D}$) = real portion of $\overline{D}$
$f_o = f_{nom} + f_c$ = predetermined reference frequency
f = actual system frequency
$f_{nom}$ = nominal system frequency
$f_c = (f_s/N) - f_{nom}$ = frequency correction;
N = samples per cycle
$\eta$ = frequency distortion factor; and
$f_s$ = sampling frequency.

Frequency correction factor $f_c$ is typically small, and reflects the fact that it may not be possible to adjust the sampling frequency (typically a binary multiple of a crystal frequency) to be exactly equal to an integer multiple of the nominal system frequency. The method of the present invention operates over a frequency deviation range of plus or minus one-half of nominal frequency $f_{nom}$. Typical nominal frequencies for a power system are 25, 50, 60 and 400 Hz although any nominal frequency may be accommodated with the present invention. Since the signs of the numerator and denominator of the left hand expression in equation (5) are both available, a four-quadrant inverse tangent (i.e. arc tan or $\tan^{-1}$) function can be performed by inverse tangent circuitry 170. Inverse tangent circuitry 170 may determine the inverse tangent of x (in radians) in accordance with the formula $$\tan^{-1} x = \frac{x}{1 + 0.28x^2} + \epsilon(x) \qquad 5$$

wherein the absolute value of the error $\epsilon(x)$ is less than or equal to $5 \times 10^{-3}$ for $-1 \leq x \leq 1$, and $x = \text{IMAG}(\overline{D})/\text{REAL}(\overline{D})$. If it is desired to operate only over a range of plus or minus ¼ of nominal frequency $f_{nom}$, a two quadrant inverse tangent function is adequate. The other correction factor, i.e. frequency distortion factor $\eta$ is very close to 1 for small frequency deviations (e.g. less than about 1 Hz.) from nominal frequency $f_{nom}$. Frequency distortion factor $\eta$ is determined in accordance with the following equation:

$$\eta(f, f_o, N) = \frac{A^2 - B^2}{A^2 + B^2} \qquad (6)$$

wherein:

$$A = \sin\left[\frac{2\pi}{N} \cdot \left(\frac{f - f_o}{f_o}\right) + \frac{2\pi}{N}\right], \text{ and}$$

$$B = \sin\left[\frac{2\pi}{N} \cdot \frac{(f - f_o)}{f_o}\right].$$

The output of inverse tangent circuitry 170, which comprises the frequency deviation signal $(f-f_o)/f_o$, is coupled to circuitry 190 (which may comprise a program in microprocessor 40 (FIG. 1)) to convert the frequency deviation signal to the actual system frequency signal f in accordance with the following formula $$f = \left(\frac{f - f_o}{f_o} + 1\right) \cdot f_o.$$

The actual system frequency signal f is available at the output of frequency conversion circuitry 190. Both the frequency deviation signal and the actual system frequency signal are available as digitally encoded signals and may be supplied to display means 90 (FIG. 1) for providing an operator with an indication of their respective status.

Figure 4:
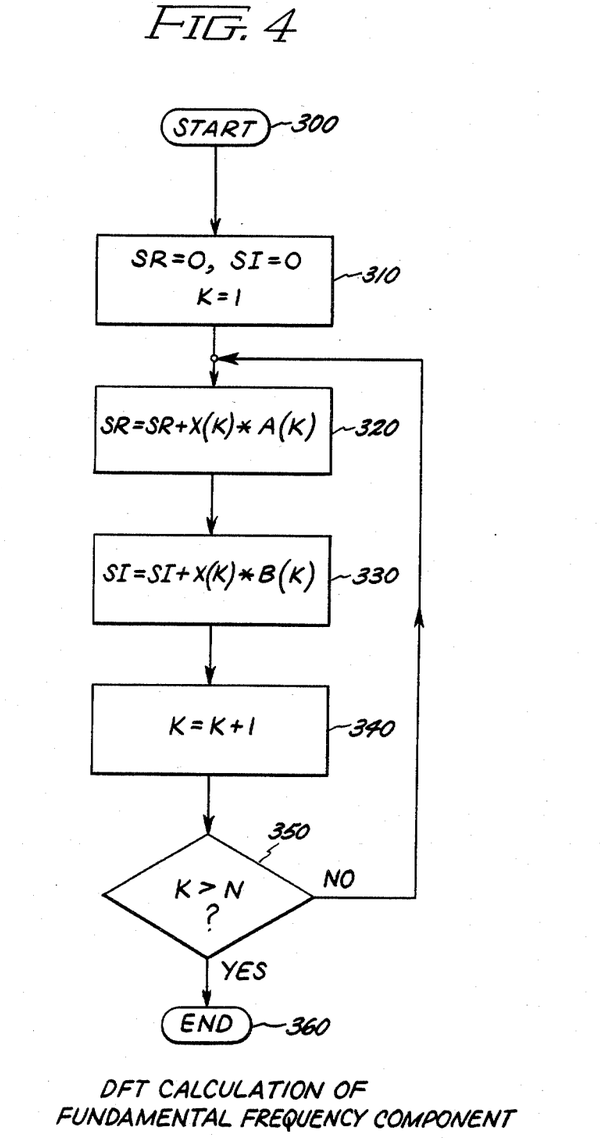
FIGS. 4 and 5 are flow diagrams of programs useful with a microprocessor of the present invention.

Shown in FIG. 4 is a flow diagram of a program stored in ROM of microprocessor 40 (FIG. 1) and useful for determining discrete Fourier transforms in accordance with the present invention. Although a separate identical program may be included for each of DFT circuitry 100-125, it is generally more efficient to provide a single program to perform each of DFT 100-125 circuit functions as needed. Thus the program of FIG. 4 as it relates to DFT circuitry 100 will be described in detail with the understanding that the program operates analogously with other DFT circuitry 105-125.

The program begins at step 300 and first initializes values by executing step 310 which sets the index counter k equal to one and sets the sum of real storage register SR and the sum of imaginary storage register SI, respectively, equal to zero. Execution of step 320 causes the previous value of the SR register to be added to the product of X(k) and A(k) and the resulting sum to be stored in the SR register, wherein A(k) is the real portion of $$(2/N) \cdot e^{-j\frac{2\pi k}{N}}$$

and X(k) is $V_{\alpha\beta}(k\Delta t)$, i.e. the measured value of the kth data sample of a sampled cycle [e.g. $V_{a1} \cdot (k\Delta t)$ for phase A, first sampled cycle].

Execution of step 330 causes the previous value of the SI register to be added to the product of X(k) and B(k) and the resulting sum to be stored in the SI register, wherein B(k) is the imaginary portion of $$(2/N) \cdot e^{\frac{-j2\pi k}{N}}$$

and X(k) is $V_{\alpha\beta}(k\Delta t)$, i.e. the measured value of the kth data sample of a sampled cycle [e.g. $V_{a1} \cdot (k\Delta t)$ for phase A, first sampled cycle].

Performing step 340 increments the index counter by 1 and execution of step 350 determines whether index counter k is greater than samples per cycle N. If k is less than or equal to N then step 320 is repeated. If k is greater than N, then step 360 is performed to indicate that the DFT for one set of samples (i.e. one sampled cycle) is finished. The values remaining in the SR and SI registers at the execution of step 360, which are the real and imaginary portions of the sampled cycle phasor (e.g. $\overline{V}_{a1}$) are stored in respective appropriate memory locations in microprocessor 40 (FIG. 1) for later recall and the program of FIG. 4 is available to perform another DFT, such as for DFT circuitry 105, using data samples from a second sampled cycle of phase A.

Figure 5:
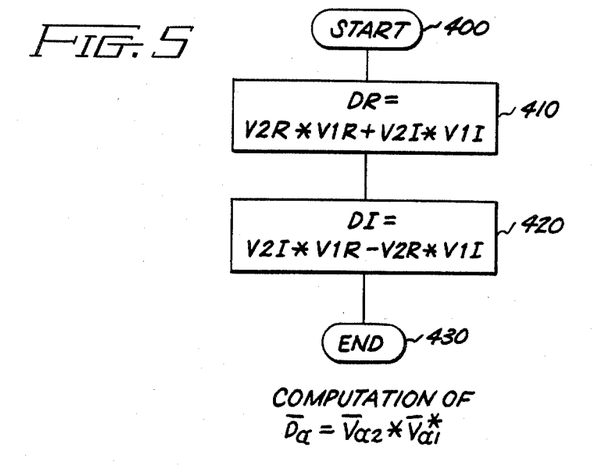

Referring to FIG. 5, a flow diagram of a program stored in ROM of microprocessor 40 (FIG. 1) and useful for determining phase deviation phasors $\overline{D}_a$ in accordance with the present invention is shown. Like the DFT program of FIG. 4, it is preferable to have a single deviation phasor program to perform each of phasor multiplying means 130, 140 and 150 circuit functions as needed.

The program of FIG. 5 starts by executing step 400 and proceeds to execute step 410 which causes a deviation real register DR to be supplied with the sum of two products: V2R * V1R and V2I * V1I, wherein V2R is the value of the SR register for the second sampled cycle, V1R is the value of the SR register for the first sampled cycle, V2I is the value of the SI register for the second sampled cycle and V1I is the value of the SI register for the first sampled cycle. These values are all available from their appropriate memory locations as determined in accordance with the program of FIG. 4. Step 420 is then executed to cause a deviation imaginary register DI to be supplied with the difference of two products: V2I * V1R and V2R * V1I, wherein V2I, V1R, V2R and V1I are the same values as defined for step 410. The execution of step 430 signifies that the complex arithmetic computations for a phase have been completed. The values remaining in the DR and DI registers, which are the real and imaginary portions, respectively, of the respective phase deviation phasor $\overline{D}_a$, are stored in appropriate memory locations in microprocessor 40 (FIG. 1).

The phase deviation phasors $\overline{D}_a$, $\overline{D}_b$ and $\overline{D}_c$ from multiplying means 130, 140 and 150 (FIG. 3), respectively, are algebraically added by adder 160 (FIG. 3). The sum of the phase deviation phasors is a frequency deviation phasor $\overline{D}$ which constitutes the output signal of adder 160 and also the output signal of microprocessor 40 (FIG. 1) supplied to conditioning circuit 50 (FIG. 1).

Figure 6:
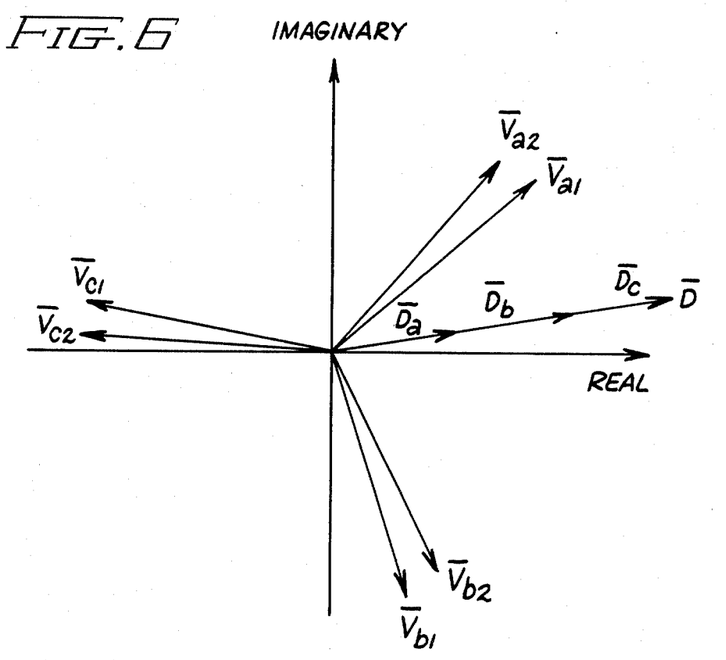
FIG. 6 is a diagram of typical phasors for a 3-phase system determined in accordance with the present invention.

Referring to FIG. 6, typical phasors resulting from operation of the method of the present invention are shown for a 3-phase system. Phase deviation phasors $\overline{D}_a$, $\overline{D}_b$, and $\overline{D}_c$ are shown co-linearly such that the distance from the origin of the real and imaginary axes to the tip of deviarion phasor $\overline{D}_c$ represents frequency deviation phasor $\overline{D}$.

Figure 7:
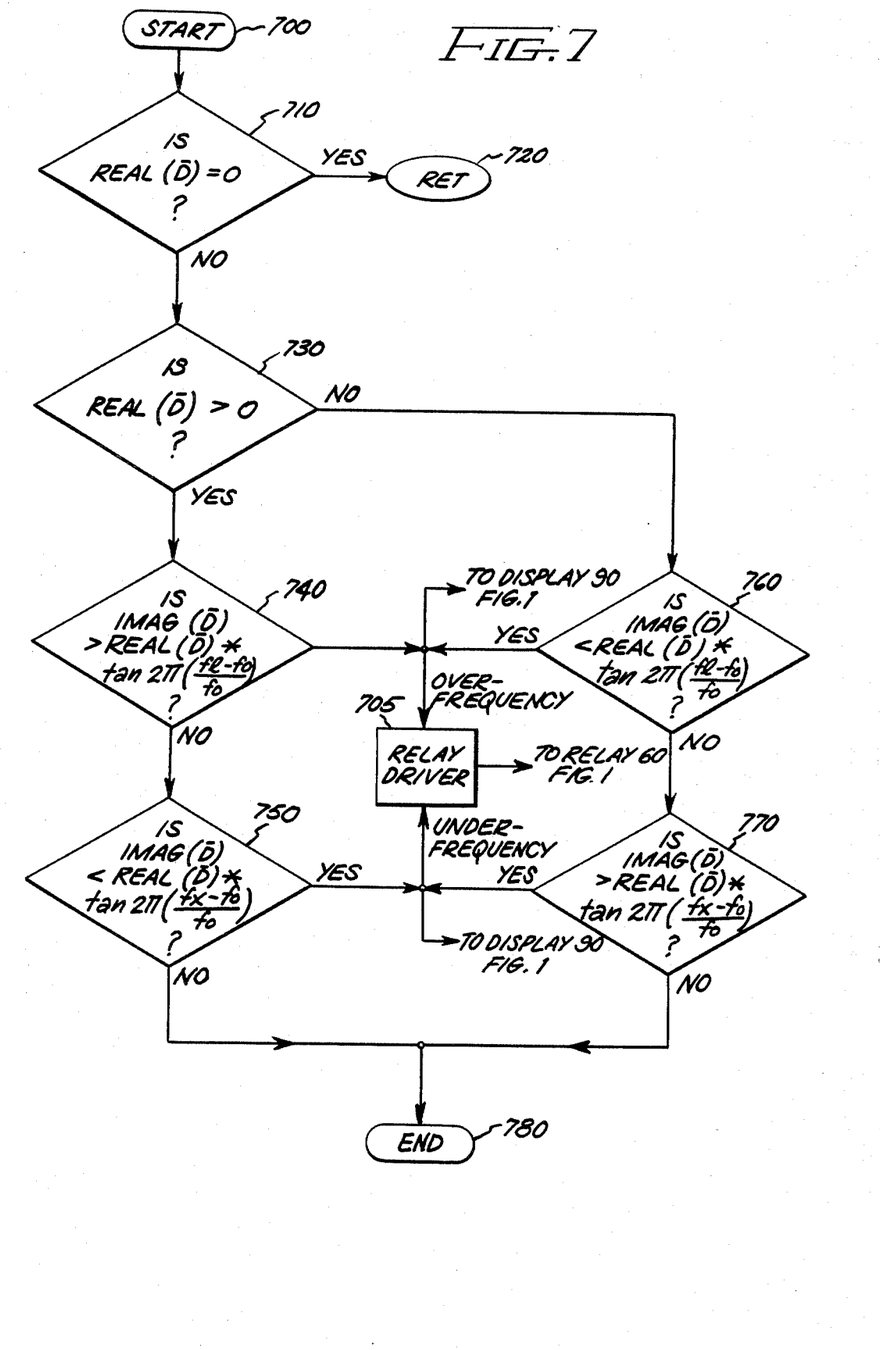
FIG. 7 is a flow diagram of a program useful with a microprocessor of the present invention.

The method of the present invention may be used to provide a display of actual system signal frequency or frequency deviation and/or to perform frequency limited checking, i.e. determine if the actual system frequency is outside predetermined limits. For display purposes, equation (5) must be solved such as by using inverse tangent circuitry 170 (FIG. 3). For limit checking, it is not necessary to perform any trigonometry in real time. Frequency limit checking can be performed according to the following equations:

for over-frequency:

$$\text{IMAG}(\overline{D}) > \text{REAL}(\overline{D}) \cdot \tan 2\pi \frac{(f_1 - f_o)}{f_o}, \text{ for REAL}(\overline{D}) > 0, \quad (7)$$

and $$\text{IMAG}(\overline{D}) < \text{REAL}(\overline{D}) \cdot \tan 2\pi \frac{(f_1 - f_o)}{f_o}, \text{ for REAL}(D) < 0, \quad (8)$$

for under-frequency:

$$\text{IMAG}(\overline{D}) < \text{REAL}(\overline{D}) \cdot \tan 2\pi \frac{(f_x - f_o)}{f_o}, \text{ for REAL}(\overline{D}) > 0, \quad (9)$$

and $$\text{IMAG}(\overline{D}) > \text{REAL}(\overline{D}) \cdot \tan 2\pi \frac{(f_x - f_o)}{f_o}, \text{ for REAL}(\overline{D}) < 0, \quad (10)$$

wherein:
$f_1$ = upper limit frequency; and
$f_x$ = lower limit frequency;
by conditioning circuit 50 (FIG. 1) in accordance with the program shown in FIG. 7. This requires a trignometric calculation only when the predetermined frequency limit threshold is being set, i.e. determining tan $2\pi(f_x - f_o)/f_o$ and tan $2\pi(f_x - f_o)/f_o$ and storing the results for later recall.

Referring to FIG. 7, a program for determination by conditioning circuit 50 (FIG. 1) whether the under- or over-frequency limits are exceeded is shown. The program starts at step 700 and proceeds to execute step 710 to determine if the real portion of frequency deviation phasor $\overline{D}$ (REAL ($\overline{D}$)) is equal to zero. If it is equal to zero, indicating that the system frequency is equal to the predetermined reference frequency $f_o$, then step 720 is performed to return control to another program in microprocessor 40 (FIG. 1).

If REAL ($\overline{D}$) is not equal to zero, step 730 determines if REAL ($\overline{D}$) is greater than zero. If REAL($\overline{D}$) is greater than zero step 740 is performed and if REAL ($\overline{D}$) is less than zero step 760 is performed. Step 740 and step 760 determine if the imaginary portion of frequency deviation phasor $\overline{D}$ (IMAG ($\overline{D}$)) is greater than or less than, respectively, the product of REAL ($\overline{D}$)times tan $2\pi(f_1 - f_o)/f_o$; wherein $f_1$ is the upper limit frequency and $f_o$ is the predetermined reference frequency. If either step 740 or step 760 provides an affirmative response, then an over-frequency signal is supplied to relay driver 705 to actuate relay 60 (FIG. 1) which in turn removes power supplied to the power system. Additionally, the over-frequency signal is provided to display means 90 (FIG. 1).

If neither step 740 nor step 760 provides an affirmative response then step 750 or step 770 is performed, respectively. Step 750 and step 770 determine if IMAG ($\overline{D}$) is less than or greater than, respectively, the product of REAL ($\overline{D}$) times tan $2\pi(f_x - f_o)/f_o$, wherein $f_x$ is the lower limit frequency and $f_o$ is the predetermined reference frequency. If either step 750 or step 770 provides an affirmative response, then an under-frequency signal is supplied to relay driver 705 to actuate relay 60 (FIG. 1) which in turn removes power supplied to the power system. Additionally, the under-frequency signal is provided to display means 90 (FIG. 1).

Frequency limits are set to protect an electrical generator prime mover (not shown), such as a turbine. It is generally undesirable to operate a turbine above or below predetermined mechanical resonance limits or frequencies, which are available from the manufacturer or without undue experimentation. Electrical frequency limits are selected to ensure that the prime mover operates within the permissable band of frequencies.

The frequency range of operation of the present operation, i.e. high range or low range, is selected in accordance with the following expression:

$$| \text{IMAG}_H(\overline{D}) | > | \text{REAL}_H(\overline{D}) | \cdot \left| \tan 2\pi \frac{(f_r - f_o)}{f_o} \right| \quad (11)$$

wherein
$\text{IMAG}_H(\overline{D})$ = imaginary portion of $\overline{D}$ using high range;
$\text{REAL}_H(\overline{D})$ = real portion of $\overline{D}$ using high range;
$f_r$ = range switch frequency; and
$f_o$ = predetermined reference frequency.

The range switch frequency $f_r$, which is the boundary frequency between the high and low range, is preselected and thus the value of tan $2\pi(f_r - f_o)/f_o$ may be predeterminedly calculated using any known method, such as look-up tables, and stored in an appropriate memory location of microprocessor 40 (FIG. 1) for later recall. If the left side of equation 11 is greater than the right side, then the high range is selected, otherwise the low range is selected.

As an example of a use for the present invention, consider the examole of electrically connecting a plurality of electrically separate loads, each of which is being supplied by a different generator, without interrupting power to any of the loads. By measuring the frequency of the electrical signals which are supplied to each load, in accordance with the present invention, and adjusting the frequency of each respective signal to be equal to each other signal, all loads may safely be electrically interconnected.

Thus has been illustrated and described a means and method for accurately measuring system frequency which does not employ a zero crossing technique. Further, the means and method of the present invention for measuring frequency are insensitive to non-fundamental frequency components.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A method for determining frequency deviation of a signal from a predetermined reference frequency ($f_o$), comprising:

sampling said signal at at least four predetermined instants during each of a first and second cycle of said signal, wherein said first cycle precedes said second cycle, to generate a data value for each instant;

generating a first and second phasor representative of each of said first and second cycle of said signal, respectively, from the data values respectively associated with said first and second cycle of said signal; and multiplying said second phasor by the complex conjugate of said first phasor to generate a frequency deviation phasor ($\overline{D}$), wherein the angle of said frequency deviation phasor with respect to the real axis is indicative of frequency deviation of said signal from said predetermined reference frequency.

2. The method as in claim 1 wherein said signal is sampled from 8 to 24 times for each of said first and second cycle of said signal.

3. The method as in claim 1 wherein said signal is sampled 12 times for each of said first and second cycle of said signal.

4. The method as in claim 1 wherein said first and second cycles are consecutive.

5. The method as in claim 1 wherein said sampling is repeated at predetermined intervals.

6. The method as in claim 5 wherein said sampling is performed once every ten cycles of said signal.

7. The method as in claim 5 wherein said sampling is performed once every other cycle of said signal.

8. The method as in claim 1 wherein generating said first phasor comprises:

generating a component of said first phasor from each of said data values associated with the first cycle of said signal in accordance with the following expression:

$$V_1 \cdot (k\Delta t) \cdot e^{-j\frac{2\pi k}{N}}$$

wherein:
$V_1$ = first cycle data values;
$\Delta t$ = sampling period;
$N$ = samples per cycle; and
$k$ = summation index; and summing each of the components determined from the data values associated with the first cycle to produce said first phasor.

9. The method as in claim 8 wherein generating said second phasor comprises:

generating a component or said second phasor from each of said data values associated with the second cycle of said signal in accordance with the following expression:

$$V_2 \cdot (k\Delta t) \cdot e^{-j\frac{2\pi k}{N}}$$

wherein:

$V_2$ = second cycle data values
$\Delta t$ = sampling period;
$N$ = samples per cycle; and
$k$ = summation index; and summing each of the components determined from the data values associated with the second cycle to produce said second phasor.

10. The method as in claim 1 further comprising:

generating the inverse tangent of the ratio of the imaginary portion of said frequency deviation phasor (IMAG ($\overline{D}$)) divided by the real portion of said frequency deviation phasor (REAL($\overline{D}$)), wherein said inverse tangent is indicative of the frequency deviation of said signal from said predetermined reference frequency; and supplying said inverse tangent to display means for providing an indication of the frequency deviation.

11. The method as in claim 10 wherein said inverse tangent is determined in accordance with the following formula:

$$\tan^{-1}x = \frac{x}{1 + 0.28x^2} + \epsilon(x)$$

wherein x represents the ratio of the imaginary portion of said frequency deviation phasor divided by the real portion of said frequency deviation phasor.

12. The method as in claim 10 further comprising:

generating a signal from said inverse tangent representative of an actual system frequency;

supplying said actual system frequency to display means for providing an indication of the actual system frequency.

13. The method as in claim 1 further comprising:

generating an over-frequency warning if the imaginary portion of said frequency deviation phasor (IMAG($\overline{D}$)) is greater than the real portion of said frequency deviation phasor (REAL($\overline{D}$)) times tan $2\pi(f_1-f_o)/f_o$, wherein $f_1$ is a predetermined upper frequency limit and if REAL($\overline{D}$) is greater than zero;

generating an over-frequency warning if IMAG($\overline{D}$)<REAL($\overline{D}$)·tan $2\pi(f_x-f_o)/f_o$ and if REAL ($\overline{D}$) is less than zero;

generating an under-frequency warning if IMAG($\overline{D}$)<REAL($\overline{D}$)·tan $2\pi(f_x-f_o)/f_o$ wherein $f_x$ is a predetermined lower frequency limit and if REAL($\overline{D}$) is greater than zero; and generating an under-frequency warning if IMAG($\overline{D}$)>REAL($\overline{D}$)·tan $2\pi(f_x-f_o)/f_o$ is less than zero.

14. The method as in claim 13 wherein said signal is representative of the frequency of a power system and generating an over-frequency warning comprises:

removing power supplying said power system; and
providing an indication of said over-frequency warning.

15. The method as in claim 13 wherein said signal is representative of the frequency of a power system and generating an under-frequency warning comprises:

removing power supplying said power system; and
providing an indication of said under-frequency warning.

16. The method of claim 1 further comprising displaying the frequency deviation of said signal from said predetermined reference frequency.

17. The method of claim 1 wherein generating a first and second phasor comprises generating a discrete Fourier transform for each of said first and second cycle of said signal, respectively, from the data values respectively associated with said first and second cycle of said signal.

18. A method for determining frequency deviation of a signal from a predetermined reference frequency ($f_o$), said signal comprising a plurality of phases, comprising:
sampling at least one of the phases at at least four predetermined instants during each of a first and second cycle of said at least one of the phases, wherein said first cycle precedes said second cycle, to generate a data value for each instant;
generating a first and second phasor representative of each of said first and second cycle of said at least one of the phases, respectively, from the data values respectively associated with said first and second cycle of said at least one of the phases; and
multiplying said second phasor by the complex conjugate of said first phasor to generate a phase deviation phasor ($\overline{D}_\alpha$) for said at least one of the phases wherein the angle of said phase deviation phasor with respect to the real axis is indicative of frequency deviation of the respective phase from said predetermined reference frequency.

19. The method as in claim 18 wherein sampling at least one of the phases comprises sampling all the phases.

20. The method as in claim 18 further comprising adding the respective phase deviation phasors to form a frequency deviation phasor ($\overline{D}$), wherein the angle of said frequency deviation phasor with respect to the real axis is indicative of frequency deviation of said signal from said predetermined reference frequency.

21. The method of claim 19 further comprising adding the respective phase deviation phasors to form a frequency deviation phasor ($\overline{D}$), wherein the angle of said frequency deviation phasor with respect to the real axis is indicative of frequency deviation of said signal from said predetermined reference frequency.

22. The method as in claim 18 wherein said sampling is repeated at predetermined intervals.

23. The method as in claim 18 wherein said sampling of said first cycle is performed once every other cycle of said signal.

24. The method as in claim 18 wherein said signal is sampled 12 times for each of said first and second cycles of said respective phases.

25. The method as in claim 18 wherein said respective first and second cycle of said at least one of the phases are consecutive.

26. The method as in claim 22 wherein said sampling of said first cycle is performed once every ten cycles of said signal.

27. The method as in claim 22 wherein said sampling of said first cycle is performed once every other cycle of said signal.

28. The method as in claim 19 wherein said respective first and second cycle of each respective phase are consecutive.

29. The method as in claim 19 wherein said sampling is repeated at predetermined intervals.

30. The method as in claim 29 wherein said sampling of said first cycle is performed once every ten cycles of said signal.

31. The method as in claim 29 wherein said sampling of said first cycle is performed once every other cycle of said signal.

32. The method of claim 18 wherein generating said first phasor comprises:
generating a component of said first phasor from each of said data values associated with the first cycle of said signal in accordance with the following expression:

$$V\alpha_1 \cdot (k\Delta t) \cdot e^{-j\frac{2\pi k}{N}}$$

wherein:
$V\alpha_1$ = first cycle data values;
$\alpha$ = phase indicator;
$\Delta t$ = sampling period;
N = samples per cycle; and
k = summation index; and
summing each of the components determined from the data values associated with each respective first cycle to produce said first phasor.

33. The method of claim 32 wherein generating said second phasor comprises:
generating a component of said second phasor from each of said data values associated with the second cycle of said signal in accordance with the following expression:

$$V\alpha_2 \cdot (k\Delta t) \cdot e^{-j\frac{2\pi k}{N}}$$

wherein:
$V\alpha_2$ = second cycle data values;
$\alpha$ = phase indicator;
$\Delta t$ = sampling period;
N = samples per cycle; and
k = summation index; and
summing each of the components determined from the data values associated with each respective second cycle to produce said second phasor.

34. The method of claim 19 wherein generating said first phasor comprises:
generating a component of each said respective first phasor from each of said data values associated with the respective first cycle of said signal in accordance with the following expression:

$$V\alpha_1 \cdot (k\Delta t) \cdot e^{-j\frac{2\pi k}{N}}$$

wherein:
$V\alpha_1$ = first cycle data values;
$\alpha$ = phase indicator;
$\Delta t$ = sampling period
N = samples per cycle; and
k = summation index; and
summing each of the components determined from the data values associated with each respective first cycle to produce each said respective first phasor.

35. The method as in claim 34 wherein generating said second phasor comprises:
generating a component of each said respective second phasor from each of said data values associated with the respective second cycle of said signal in accordance with the following expression:

$$V\alpha_2 \cdot (k\Delta t) \cdot e^{-j\frac{2\pi k}{N}}$$

wherein:

$V\alpha_2$ = second cycle data values;
$\alpha$ = phase indicator;
$\Delta t$ = sampling period;
$N$ = samples per cycle; and
$k$ = summation index; and
summing each of the components determined from the data values associated with each respective second cycle to produce each said respective first phasor.

36. The method as in claim 20 further comprising:
generating the inverse tangent of the ratio of the imaginary portion of said frequency deviation phasor ($IMAG(\overline{D})$) divided by the real portion of said frequency deviation phasor ($REAL(\overline{D})$) wherein said inverse tangent is indicative of the frequency deviation of said signal from said predetermined reference frequency; and
supplying said inverse tangent to display means for providing an indication of the frequency deviation.

37. The method as in claim 36 wherein said inverse tangent is determined in accordance with the following formula:

$$\tan^{-1} x = \frac{x}{1 + 0.28x^2} + \epsilon(x)$$

wherein x represents the ratio of the imaginary portion of said frequency deviation phasor divided by the real portion of said frequency deviation phasor.

38. The method as in claim 36 further comprising:
generating a signal from said inverse tangent representative of an actual system frequency; and
supplying said actual system frequency to display means for providing an indication of the actual system frequency.

39. The method as in claim 20 further comprising:
generating an over-frequency warning if the imaginary portion of said frequency deviation phasor $IMAG(\overline{D})$ is greater than the real portion of said frequency deviation phasor ($REAL(\overline{D})$) times tan $2\pi(f_1-f_o)/f_o$, wherein $f_1$ is a predetermined upper frequency limit and if $REAL(\overline{D})$ is greater than zero;
generating an over-frequency warning if $IMAG(\overline{D}) < REAL(\overline{D}) \cdot \tan 2\pi(f_1-f_o)/f_o$ and if $REAL(\overline{D})$ is less than zero;
generating an under-frequency warning if $IMAG(\overline{D}) < REAL(\overline{D}) \cdot \tan 2\pi(f_x-f_o)/f_o$, wherein $f_x$ is a predetermined lower frequency limit and if $REAL(\overline{D})$ is greater than zero; and
generating an under-frequency warning if $IMAG(\overline{D}) > REAL(\overline{D}) \cdot \tan 2\pi(f_x-f_o)/f_o$ and if $REAL(\overline{D})$ is less than zero.

40. The method as in claim 39 wherein said signal is representative of the frequency of a power system and generating an over-frequency warning comprises:
removing power supplying said power system; and
providing an indication of said over-frequency warning.

41. The method as in claim 39 wherein said signal is representative of the frequency of a power system and generating an under-frequency warning comprises:
removing power supplying said power system; and
providing an indication of said under-frequency warning.

42. The method as in claim 18 wherein generating a first and second phasor comprises generating a discrete Fourier transform for each of said first and second cycles of each said at least one of the phases, respectively, from the data values respectively associated with said first and second cycles of said signal.

43. Apparatus for determining the frequency deviation of a system signal from a predetermined reference frequency ($f_o$), comprising:
first transform means adapted to receive a first plurality of samples indicative of a first cycle of said system signal for generating the discrete Fourier transform of said first cycle of said system signal in response to said first plurality of samples;
second transform means adapted to receive a second plurality of samples indicative of a second cycle of said system signal for generating the discrete Fourier transform of said second cycle of said system signal in response to said second plurality of samples, wherein said first cycle of said system signal precedes said second cycle of said system signal;
multiplying means coupled to the output of each of said first and second transform means, respectively, for multiplying the discrete Fourier transform of said second cycle of said system signal by the complex conjugate of the discrete Fourier transform of said first cycle of said system signal to form a frequency deviation phasor; and
conditioning means coupled to the output of said multiplying means for providing signals indicative of under-frequency and over-frequency, respectively, of said system signal with respect to said predetermined reference frequency.

44. The apparatus of claim 43 further comprising:
arc tangent means coupled to said multiplying means for generating the inverse tangent of said frequency deviation phasor, said inverse tangent indicative of the frequency deviation of said system signal from said predetermined reference frequency; and
display means coupled to said arc tangent means for providing an indication of said frequency deviation of said system signal.

45. The apparatus of claim 43 wherein said system signal is representative of the frequency of a power system and further comprising switching means coupled to said conditioning means for stopping the supply of power to said power system in response to said under-frequency and said over-frequency signals, respectively.

46. The apparatus of claim 43 further comprising:
arc tangent means coupled to said multiplying means for generating the inverse tangent of said frequency deviation phasor;
frequency conversion means coupled to said arc tangent means for generating a frequency signal indicative of the frequency of said system signal; and
display means coupled to said frequency conversion means for providing an indication of the frequency of said system signal.

47. Apparatus for determining the frequency deviation of a system signal from a predetermined reference frequency ($f_o$), said system signal including a plurality of phases, comprising:
a first plurality of transform means each respectively adapted to receive a first plurality of samples indicative of a respective first cycle of each phase of said system signal for generating the respective discrete Fourier transform of said respective first cycle of each phase of said system signal in response to said respective first plurality of samples;

a second plurality of transform means each respectively adapted to receive a second plurality of samples indicative of a respective second cycle of each phase of said system signal for generating the respective discrete Fourier transform of said respective second cycle of each phase of said system signal in response to said respective second plurality of samples, wherein each said respective first cycle of each phase of said system signal precedes each said respective second cycle of each phase of said system signal;

a plurality of multiplying means each respectively coupled to the output of one of said first and one of said second plurality of transform means, respectively, both said one of said first and said one of said second transform means adapted to receive samples from the same phase of said system signal, each of said multiplying means, respectively, multiplying the discrete Fourier transform of said second cycle of said respective phase of said second cycle of said respective phase of said system signal by the complex conjugate of the discrete Fourier transform of said first cycle of said respective phase of said system signal to form a plurality of respective phase deviation phasors;

adder means having inputs respectively coupled to the output of each of said plurality of multiplying means for summing each of said respective phase deviation phasors to form a frequency deviation phasor ($\overline{D}$); and conditioning means coupled to the output of said adder means for providing signals indicative of under-frequency and over-frequency, respectively, of said system signal with respect to said predetermined reference frequency.

48. The apparatus of claim 47 further comprising:
arc tangent means coupled to said adder means for generating the inverse tangent of said frequency deviation phasor, said inverse tangent indicative of the frequency deviation of said system signal from said predetermined reference frequency; and
display means coupled to said arc tangent means for providing an indication of said frequency deviation of said system signal.

49. The apparatus of claim 47 wherein said system signal is representative of the frequency of a power system, said apparatus further comprising switching means coupled to said conditioning means for stopping the supply of power to said power system in response to said under-frequency and said over-frequency signals, respectively.

50. The apparatus of claim 47 further comprising:
arc tangent means coupled to said adder means for generating the inverse tangent of said frequency deviation phasor;
frequency conversion means coupled to said arc tangent means for generating a frequency signal indicative of the frequency of said system signal; and
display means coupled to said frequency conversion means for providing an indication of the frequency of said system signal.

* * * * *